United States Patent
Bailly et al.

(10) Patent No.: US 10,006,954 B2
(45) Date of Patent: Jun. 26, 2018

(54) METHOD AND A SYSTEM FOR MONITORING THE RELIABILITY OF AT LEAST ONE PIECE OF ELECTRONIC EQUIPMENT INSTALLED IN AN AIRCRAFT

(71) Applicant: AIRBUS HELICOPTERS, Marignane (FR)

(72) Inventors: Stephane Bailly, Cabries (FR); Vincent Schmidt, Aix en Provence (FR)

(73) Assignee: AIRBUS HELICOPTERS, Marignane (FR)

( * ) Notice: Subject to any disclaimer, the term of this patent is extended or adjusted under 35 U.S.C. 154(b) by 90 days.

(21) Appl. No.: 15/377,142

(22) Filed: Dec. 13, 2016

(65) Prior Publication Data

US 2017/0212162 A1   Jul. 27, 2017

(30) Foreign Application Priority Data

Dec. 18, 2015   (FR) ..................................... 15 02641

(51) Int. Cl.
*G01R 31/00* (2006.01)

(52) U.S. Cl.
CPC ................... *G01R 31/008* (2013.01)

(58) Field of Classification Search
CPC ............................ G01R 31/006; G01R 31/025
See application file for complete search history.

(56) References Cited

U.S. PATENT DOCUMENTS 5,746,397 A * 5/1998 DeField ................. B64D 27/26
 137/209
2008/0172268 A1 7/2008 Wingenter
(Continued)

FOREIGN PATENT DOCUMENTS

CN          102184292         9/2011

OTHER PUBLICATIONS

French Search Report for French Application No. FR 1502641, Completed by the French Patent Office, dated Aug. 23, 2016, 9 Pages.
(Continued)

*Primary Examiner* — Jermele M Hollington
*Assistant Examiner* — Alvaro Fortich
(74) *Attorney, Agent, or Firm* — Brooks Kushman P.C.

(57) ABSTRACT

A monitor system for monitoring the reliability of at least one piece of electronic equipment installed in an aircraft. In order to monitor each piece of electronic equipment, such a monitor system comprises: monitor means for measuring variations of at least one state parameter P as a function of time t; concatenation means for generating data groups ($t_i$, $P_i$, $S_j$); transmission means for transmitting the data groups ($t_i$, $P_i$, $S_j$) to a centralized unit; first computation means for determining an observed reliability $R_{obs}$ of the or each piece of electronic equipment; second computation means for determining an expected reliability $R_{exp}$ of the or each piece of electronic equipment; comparator means for comparing the observed reliability $R_{obs}$ with the expected reliability $R_{exp}$ of the or each piece of electronic equipment; and warning means.

13 Claims, 3 Drawing Sheets

(56) References Cited

U.S. PATENT DOCUMENTS

| | | |
|---|---|---|
| 2008/0313501 A1 | 12/2008 | Lin et al. |
| 2011/0112705 A1* | 5/2011 | Antraygue ............... B64C 13/12 |
| | | 701/3 |
| 2014/0181595 A1 | 6/2014 | Hoang et al. |
| 2014/0188405 A1 | 7/2014 | Ba |
| 2015/0028877 A1* | 1/2015 | McCormick ......... H01H 47/002 |
| | | 324/418 |

OTHER PUBLICATIONS

Lopez et al. Progress in Aerospace Sciences, 2010, vol. 46, pp. 247-273, XP 027218802, "A review of uncertainty in flight vehicle structural damage monitoring, dianosis and control: Challenges and opportunities".

* cited by examiner

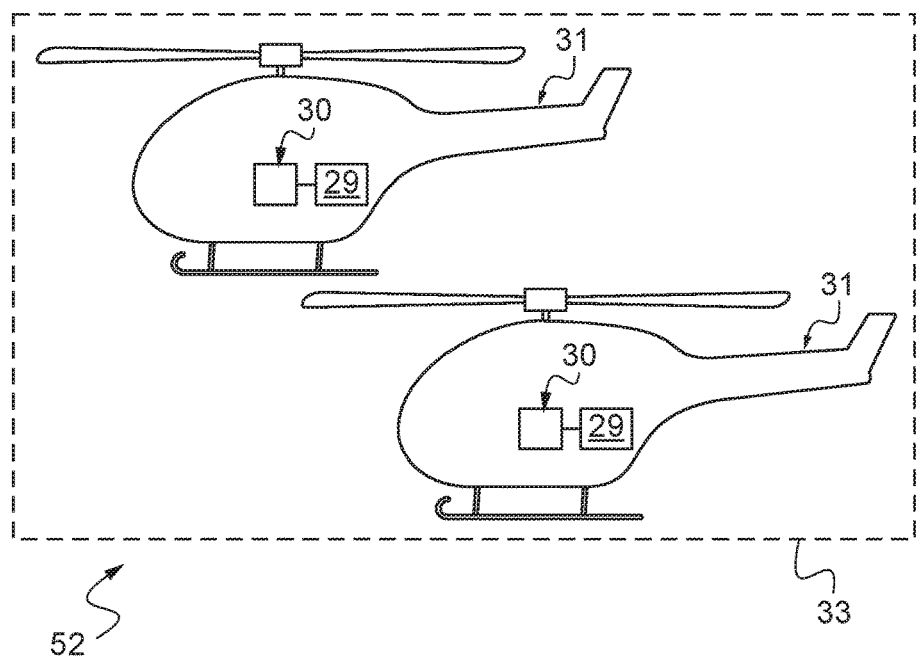
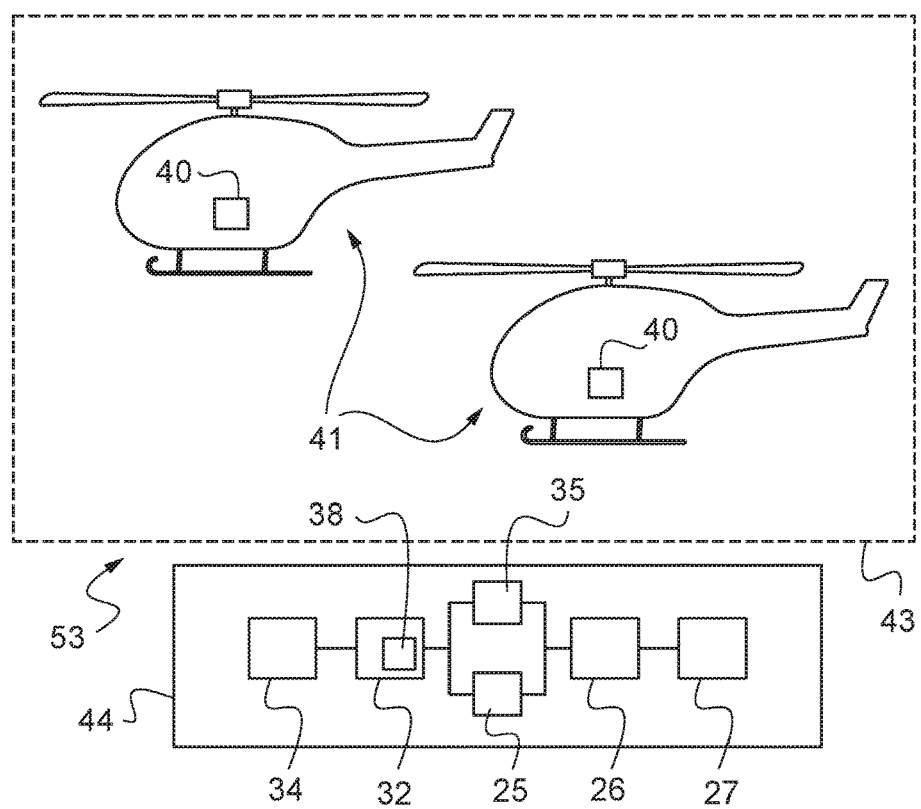

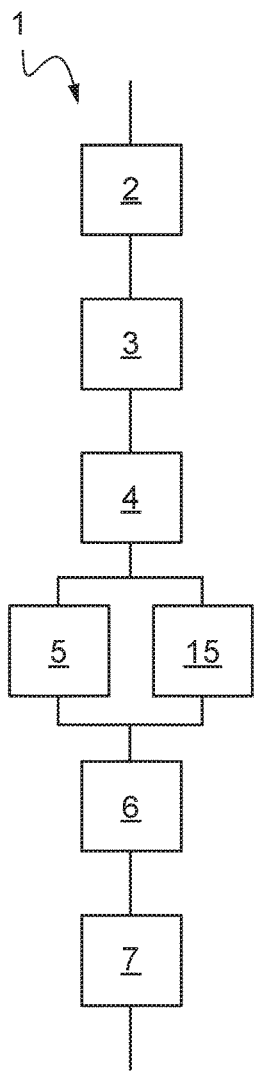
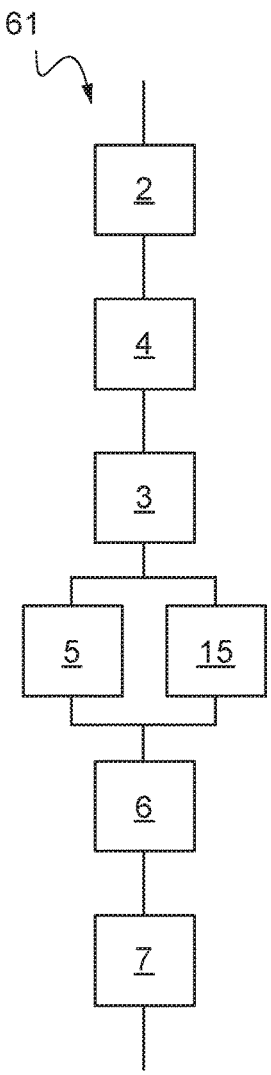
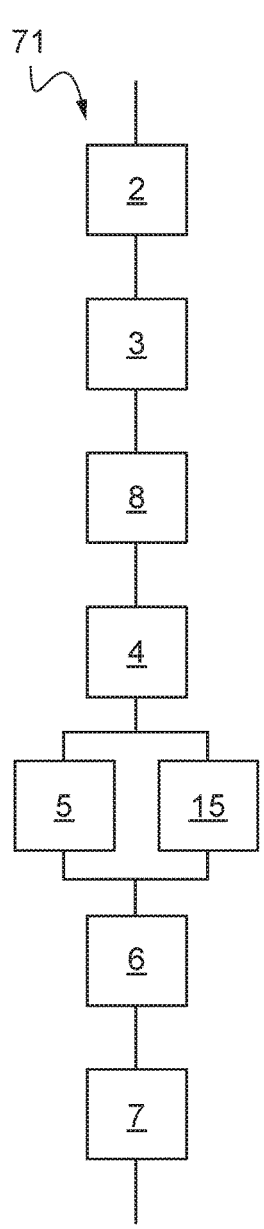
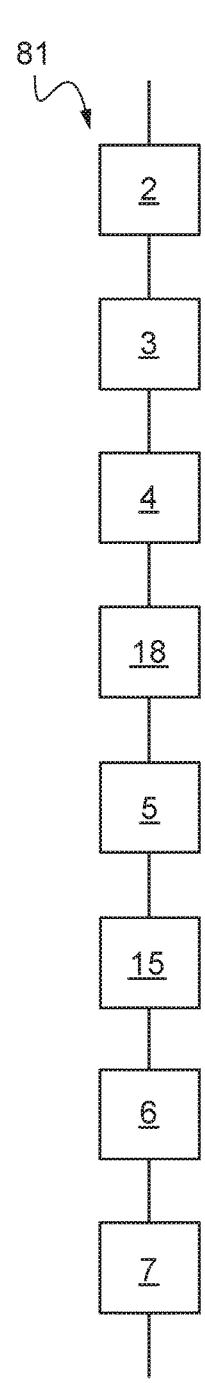

METHOD AND A SYSTEM FOR MONITORING THE RELIABILITY OF AT LEAST ONE PIECE OF ELECTRONIC EQUIPMENT INSTALLED IN AN AIRCRAFT

CROSS REFERENCE TO RELATED APPLICATION

This application claims priority to French patent application No. FR 15 02641 filed on Dec. 18, 2015, the disclosure of which is incorporated in its entirety by reference herein.

BACKGROUND OF THE INVENTION (1) Field of the Invention

The field of the present invention relates to the reliability of electronic equipment or sub-equipment in an aircraft, such as in particular an airplane or a rotorcraft. Such electronic equipment or sub-equipment may be made up of one or more electronic components such as chips, microprocessors, or electronic cards. Such pieces of electronic equipment or sub-equipment may also consist in one or more electronic components such as chips, microprocessors, or electronic cards.

(2) Description of Related Art

Such electronic equipment may suffer failures or malfunctions that are random, thus preventing any preventative action by replacement. Such electronic equipment is therefore maintained in corrective manner whenever a random failure occurs. Thus, it is essential for an aircraft manufacturer to use electronic equipment having reliability that can be predicted in worthwhile manner.

The term "predicted reliability" is used to designate reliability determined by calculation upstream from an operator of the electronic equipment by using a reliability model for predetermined functional and environmental conditions.

Thus, such predicted reliability corresponds to estimating a probability of failure by calculation as a function of certain functional conditions for a piece of electronic equipment or as a function of certain environmental conditions.

The invention thus relates more precisely to a monitoring method and system that make it possible firstly to measure environmental and functional conditions of such electronic equipment while it is in operation, and secondly to determine an expected reliability for said electronic equipment under verifiable environmental and functional conditions.

The expected reliability is thus the expected result given by a reliability model that takes functional and environmental conditions as its parameters, when that model is given the conditions actually seen by the electronic equipment as its parameters.

Furthermore, the observed reliability of a piece of electronic equipment corresponds to reliability determined on the basis of a measured operating time interval between two successive failures of a given component.

In general manner in the field of aviation, and as described in particular in the following documents: XP 027218802 ("A review of uncertainty in flight vehicle structural damage monitoring, diagnosis and control: challenges and opportunities" by I. Lopez et al.), US 2014/188405 A1, US 2008/313501 A1, and US 2008/172268 A1, it is known to determine the observed reliability of a piece of electronic equipment in order to compare it with a predicted reliability. Nevertheless, such a comparison cannot be adapted as a function of the environmental and functional conditions of such electronic equipment while it is in operation.

Consequently, with the vast majority of methods for monitoring reliability that are presently known, it is not possible to determine whether a difference between the observed reliability and the predicted reliability for a piece of electronic equipment is due, for example: to a problem in the design of the electronic equipment, or to a component in the electronic equipment, or indeed on the contrary to environmental or functional conditions of such electronic equipment while it was in operation.

Document US 2014/181595 A1 describes a method of monitoring the reliability of an SSD type storage unit. It describes using an environmental sensor for making a reliability model as a function of real usage of the storage unit.

However, in Document US 2014/181595 A1, the storage unit is not described as being electronic equipment installed in an aircraft. Furthermore, there is likewise nothing to say that reliability is determined on the basis of failure data transmitted by an operator when replacing a piece of electronic equipment.

Furthermore, that document also does not describe the particular calculation of an observed reliability obtained specifically from such failure data, followed by comparing that reliability with an expected reliability, and even less does it describe generating a warning signal if the observed reliability is less than the expected reliability as calculated, in particular as a function of variations in at least one state parameter P and as a function of a predicted reliability.

BRIEF SUMMARY OF THE INVENTION

An object of the present invention is thus to propose a monitoring method adapted to the field of electronic equipment on board aircraft that makes it possible to overcome the above-mentioned limitations.

Specifically, such a monitoring method makes it possible firstly to identify a difference between the observed reliability and the expected reliability for a piece of electronic equipment.

Secondly, the monitoring method makes it possible to warn a person or a crew of a specialized service automatically when such a difference occurs between the observed reliability and the expected reliability for the electronic equipment.

Finally, and thirdly, the monitoring method facilitates identifying the cause of any difference between the observed reliability and the expected reliability for the electronic equipment.

The invention thus provides a monitoring method for monitoring the reliability of one or more pieces of electronic equipment installed in an aircraft.

Such a monitoring method is remarkable in that, for the or each of the pieces of electronic equipment, it performs the following:

a measuring step serving to measure variations in at least one state parameter P as a function of time t;

a concatenation step for generating data groups $(t_i, P_i, S_j)$, each formed respectively by:
  an instant $t_i$ representative of a sampling time parameter of the measuring step of the monitoring method;
  a value $P_i$ of the at least one state parameter P measured at the instant $t_i$; and
  an identification number $S_j$ specific to each piece of electronic equipment;

a transmission step for transmitting the data $t_i$, $P_i$, $S_j$ to a centralized unit serving to collect and store a set of data groups $(t_i, P_i, S_j)$ coming from a fleet of aircraft including the piece(s) of electronic equipment;

a first computation step serving to determine an observed reliability $R_{obs}$ of the piece(s) of electronic equipment for the fleet of aircraft, firstly from the set E of data groups ($t_i$, $P_i$, $S_j$) collected and stored in the centralized unit, and secondly from failure data $D_p$ generated when replacing a faulty piece of electronic equipment;

a second computation step for determining an expected reliability $R_{exp}$ of the piece(s) of electronic equipment for the fleet of aircraft, firstly from the set E of data groups ($t_i$, $P_i$, $S_j$) collected and stored in the centralized unit, and secondly from a predicted reliability $R_{pred}$ determined by calculation upstream from use of the piece(s) of electronic equipment on the fleet of aircraft;

a comparison step of comparing the expected reliability $R_{exp}$ of the piece(s) of electronic equipment with the observed reliability $R_{obs}$ of the piece(s) of electronic equipment; and a warning step for issuing a warning when the observed reliability $R_{obs}$ of the piece(s) of electronic equipment is less than the expected reliability $R_{exp}$ of the piece(s) of electronic equipment.

In other words, the measurement step provides a plurality of values $P_i$ associated with respective instants $t_i$ and representative of variation over time t of the state parameter P. These values $P_i$ and these instants $t_i$ are subsequently associated with an identification number $S_j$ that is specific to a piece of electronic equipment.

The concatenation step then serves to take the three variables $P_i$, $t_i$, and $S_j$ and form data groups ($t_i$, $P_i$, $S_j$) for each of the pieces of electronic equipment. Such a concatenation step may be performed before or after the transmission step for transmitting the data $t_i$, $P_i$, $S_j$ to a centralized unit.

Once the data groups ($t_i$, $P_i$, $S_j$) have been concatenated, the transmission step enables a set E of data groups ($t_i$, $P_i$, $S_j$) from a fleet of aircraft all including the same electronic equipment to be centralized. The centralized unit then enables the set of data groups ($t_i$, $P_i$, $S_j$) from the fleet of aircraft to be stored.

As a function of the set of data groups ($t_i$, $P_i$, $S_j$) and of a predicted reliability $R_{pred}$ determined by calculation upstream from use of the piece(s) of electronic equipment, the second computation step serves to determine an expected reliability $R_{exp}$ specific to each piece of electronic equipment as a function in particular of the values $P_i$ of the state parameter. Specifically, a first expected reliability $F_{esc1}$ of a piece of electronic equipment that has operated over a first range P1 of values $P_i$ may very likely be different from a second expected reliability $F_{esc2}$ of the same piece of electronic equipment that has operated over a second range P2 of values $P_i$. Such a predicted reliability $R_{pred}$ may be determined in particular by means of charts or predicted reliability relationships supplied by a supplier of the electronic equipment. In other words, the predicted reliability $R_{pred}$ of a piece of electronic equipment is specific to each electronic equipment supplier.

The first computation step makes use of calculation relationships for determining the observed reliability $R_{obs}$ as a function firstly of the set of data groups ($t_i$, $P_i$, $S_j$) collected and stored in the centralized unit, and secondly of failure data $D_p$ generated when replacing a faulty piece of electronic equipment.

Thereafter, the comparison step serves to make comparisons periodically and automatically between the expected reliability $R_{exp}$ and the observed reliability $R_{obs}$ specific to each piece of electronic equipment. When a significant difference is detected between the expected reliability $R_{exp}$ and the observed reliability $R_{obs}$, the warning step serves to send a warning message automatically, e.g. an email or a short message service (SMS) message, in order to warn a person or a crew when the observed reliability $R_{obs}$ is less than the expected reliability $R_{exp}$.

Naturally, such a warning signal may also be generated automatically on the basis of a predetermined difference between the observed reliability $R_{obs}$ and the expected reliability $R_{exp}$.

Advantageously, the first computation step serving to determine an observed reliability $R_{obs}$ for the piece(s) of electronic equipment may be performed on the basis of an observed reliability of a sample $R_{smpl}$, the sample comprising a limited number of the piece(s) of electronic equipment.

In other words, under such circumstances, the observed reliability $R_{obs}$ is obtained by calculation on the basis of a sample of a few tens of pieces of electronic equipment that have indeed failed.

In practice, the monitoring method may include at least one storage step for storing the data groups ($t_i$, $P_i$, $S_j$) specific to each piece of equipment.

In this way, for each piece of electronic equipment, the storage step serves to conserve the data groups ($t_i$, $P_i$, $S_j$) at least temporarily. Nevertheless, such a storage step may be performed equally well on board the aircraft prior to any step of transmitting data groups ($t_i$, $P_i$, $S_j$) to the centralized unit, or indeed outside the aircraft after performing this step of transmitting data groups ($t_i$, $P_i$, $S_j$) to the centralized unit.

In a first implementation of the invention, such a storage step may be performed before the transmission step for transmitting the data groups ($t_i$, $P_i$, $S_j$) to the centralized unit.

Thus, the storage step is performed on board the aircraft directly in a memory of the electronic equipment or in another memory of the aircraft external to the electronic equipment. Under such circumstances, the data groups ($t_i$, $P_i$, $S_j$) may be stored prior to being transmitted or merely copied into the centralized unit.

Nevertheless, in a second implementation of the invention, the storage step may also be performed after the transmission step for transmitting the data groups ($t_i$, $P_i$, $S_j$) to the centralized unit.

Under such circumstances, the data groups ($t_i$, $P_i$, $S_j$) are not stored on board the aircraft and it is these data groups ($t_i$, $P_i$, $S_j$) that are transmitted at each instant $t_i$ to the centralized unit that is external to the aircraft and that is connected to the fleet of aircraft.

In advantageous manner, the state parameter(s) P measured during the measuring step of the monitoring method may be selected from the group comprising at least the surrounding temperature, the surrounding humidity, the surrounding atmospheric pressure, the salinity level of the surrounding air, the pollution level of the surrounding air, the level of vibration, the electrical power supply voltage, electrically switching on/off, and the waveform of the input/output signals of the electronic equipment.

In this way, it is thus possible for any piece of electronic equipment of an aircraft to compare the observed reliability $R_{obs}$ with the expected reliability $R_{exp}$, e.g. as a function of the surrounding temperature, of the surrounding humidity, of the surrounding atmospheric pressure, of the salinity level of the surrounding air, of the pollution level of the surrounding air, of the vibration level, of the electrical power supply voltage, of electrically switching on/off, and of the waveform of the input/output signals of the electronic equipment.

The present invention also provides a monitor system for monitoring the reliability of one or more pieces of electronic equipment installed in an aircraft.

According to the invention, such a monitor system is remarkable in that in order to monitor the or each piece of electronic equipment, it comprises:

measurement means for measuring variations in at least one state parameter P as a function of time t;

concatenation means for generating data groups $(t_i, P_i, S_j)$ each formed respectively by:
- an instant $t_i$ representative of a sampling time parameter of the measurement means;
- a value $P_i$ of the or each state parameter P measured at the instant $t_i$; and
- an identification number $S_j$ specific to the or each piece of electronic equipment;

transmission means for transmitting the data $t_i, P_i, S_j$ to a centralized unit enabling a set of data groups $(t_i, P_i, S_j)$ to be collected and stored coming from a fleet of aircraft including the at least piece of electronic equipment;

first computation means for determining an observed reliability $R_{obs}$ of the or each piece of electronic equipment for a fleet of aircraft, firstly from the set E of data groups $(t_i, P_i, S_j)$ collected and stored in the centralized unit, and secondly from failure data $D_p$ generated when replacing defective ones of the or each piece of electronic equipment;

second computation means for determining an expected reliability $R_{exp}$ of the or each piece of electronic equipment for the fleet of aircraft, firstly from the set E of data groups $(t_i, P_i, S_j)$ collected and stored in the centralized unit and secondly from a predicted reliability $R_{pred}$ determined by calculation upstream from use of the or each piece of electronic equipment in the fleet of aircraft;

comparator means for comparing the expected reliability $R_{exp}$ of the or each piece of electronic equipment with the observed reliability $R_{obs}$ of the or each piece of electronic equipment; and warning means for issuing a warning when the observed reliability $R_{obs}$ of the or each piece of electronic equipment is less than the expected reliability $R_{exp}$ of the or each piece of electronic equipment.

In other words, and as mentioned above, such a monitor system serves to verify an observed reliability $R_{obs}$ of a piece of electronic equipment and to generate a warning message or signal automatically when the observed reliability $R_{obs}$ is less than the expected reliability $R_{exp}$ for the piece of electronic equipment.

The monitor means may in particular comprise measurement members responsive to the surroundings, such as for example temperature sensitive probes for measuring a temperature, or a rate of temperature variation, or for determining a number of temperature variations to which the electronic equipment is subjected. Likewise, the monitor means may include measurement members such as probes responsive to atmospheric pressure, or to air salinity or pollution, for example.

The monitor means may also include measurement members responsive to the use of the equipment such as for example probes sensitive to the voltage or the current of the electrical power supply of the electronic equipment in order to measure a voltage or a current, or a rate of variation in the voltage or the current, or indeed to determine a number of voltage or current variations to which the electronic equipment has been subjected. Likewise, the monitor means may include measurement members such as probes responsive to the waveform of input or output signals to or from the electronic equipment.

The concatenation means may comprise for example a processor, an integrated circuit, calculation means, a programmable system, a logic circuit, or a computer optionally dedicated to this function of grouping together time $t_i$, value $P_i$, and identity $S_j$ data items of the electronic equipment.

Such concatenation means are very likely arranged on board the aircraft, but they could also be remote from the aircraft.

The transmission means for transmitting the data $t_i, P_i, S_j$ or the data groups $(t_i, P_i, S_j)$ to the centralized unit may be in various forms.

By way of example, such transmission means may use wireless and contactless technology. The transmission means may then comprise antennas for transmitting and/or receiving a radio signal, an electromagnetic signal, and/or an optical signal. For example, a global system for mobile (GSM) signal transmission antenna may then be arranged on the aircraft to transmit data groups $(t_i, P_i, S_j)$ to the centralized unit. A GSM signal reception antenna is then arranged at the centralized unit for automatically receiving the data $t_i, P_i, S_j$ or the data groups $(t_i, P_i, S_j)$ and for forwarding them to the centralized unit.

Other wireless and contactless technologies may also be used such as in particular those making use of the WiFi, Bluetooth, Sigfox, or Lora protocols.

In another option, the transmission means may also include a physical interface enabling the data contained in a memory on board the aircraft to be read and collected. By way of example, under such circumstances, such an interface may be in the form of a memory card reader or of a port enabling a wired connection to be made with a hard disk, with a computer, or even with the electronic equipment when it itself includes an integrated memory for storing the data $t_i, P_i, S_j$ or the data groups $(t_i, P_i, S_j)$.

By way of example, the first computation means for determining the observed reliability $R_{obs}$ of the or each piece of electronic equipment may be in the form of a processor, calculation means, an integrated circuit, a programmable system, a logic circuit, or a computer optionally dedicated to this function. The first computation means then perform algorithms for calculating the observed reliability $R_{obs}$ of the or each piece of electronic equipment.

Likewise, and by way of example, the second computation means for determining the expected reliability $R_{exp}$ of the or each piece of electronic equipment may also be in the form of a processor, calculation means, an integrated circuit, a programmable system, a logic circuit, or a computer optionally dedicated to this function. The second computation means then perform algorithms for calculating the expected reliability $R_{exp}$ of the or each piece of electronic equipment by using the set E of data groups $(t_i, P_i, S_j)$ and by using the predicted reliability $R_{pred}$ determined by calculation upstream from use of the electronic equipment on the fleet of aircraft. Such predicted reliability $R_{pred}$ generally comes from data transmitted by the suppliers of the or each piece of electronic equipment, and may thus be in the form of charts specific to each supplier of electronic equipment.

Likewise, the comparator means and the warning means may by way of example be in the form of a processor, calculation means, an integrated circuit, a programmable system, a logic circuit, or a computer optionally dedicated to the comparison and warning functions. The comparator means and the warning means may then be formed by a computer that is the same as the computer performing the first and second computation means.

Advantageously, said monitor system may include at least one memory for storing said data groups $(t_i, P_i, S_j)$ specific to each piece of electronic equipment.

In other words, each time a value $P_i$ is measured by the measurement means, the memory serves to store the data groups $(t_i, P_i, S_j)$ specific to each piece of equipment. Furthermore, such a memory may be arranged directly onboard the aircraft containing the electronic equipment or else, on the contrary, outside the aircraft.

Thus, in a first example of the monitor system, the memory may be arranged on each aircraft of the fleet.

Under such circumstances, the memory may be arranged inside or outside the or each piece of electronic equipment.

Thus, when the memory is incorporated in a piece of electronic equipment, the memory may be dedicated solely to storing data groups $(t_i, P_i, S_j)$, or it may serve to store other data of the piece of electronic equipment.

In contrast, when the memory is arranged outside the electronic equipment but on board the aircraft, the memory may also serve to store a plurality of data groups $(t_i, P_i, S_j)$ coming from a plurality of pieces of electronic equipment that are distinct from one another.

In a second example of the monitor system, the memory may also be arranged in the centralized unit outside each of the aircraft of the fleet.

In this way, no data group $(t_i, P_i, S_j)$ is stored in the aircraft. Such a second example of the monitor system may be used when the transmission means comprise wireless and contactless communication means enabling the aircraft to transmit data groups $(t_i, P_i, S_j)$ constantly to the memory arranged in the centralized unit.

In practice, and by way of example, the state parameter(s) P of the monitor system may be selected from the group comprising: the surrounding temperature, the surrounding humidity, the surrounding atmospheric pressure, the salinity level of the surrounding air, the pollution level of the surrounding air, the vibration level, the electrical power supply voltage, electrically switching on/off, and the waveform of the input/output signals of the electronic equipment.

BRIEF DESCRIPTION OF THE SEVERAL VIEWS OF THE DRAWINGS

The invention and its advantages appear in greater detail from the context of the following description of examples given by way of illustration and with reference to the accompanying figures, in which:

FIGS. 1 to 4 are diagrammatic views showing different variants of monitor systems in accordance with the invention; and FIGS. 5 to 8 are flow charts showing various monitoring methods in accordance with the invention.

DETAILED DESCRIPTION OF THE INVENTION

Elements present in more than one of the figures are given the same references in each of them.

As mentioned above, the invention relates to a system for monitoring the reliability of at least one piece of electronic equipment arranged in an aircraft, such as in particular an airplane or a rotorcraft.

Figure 1:
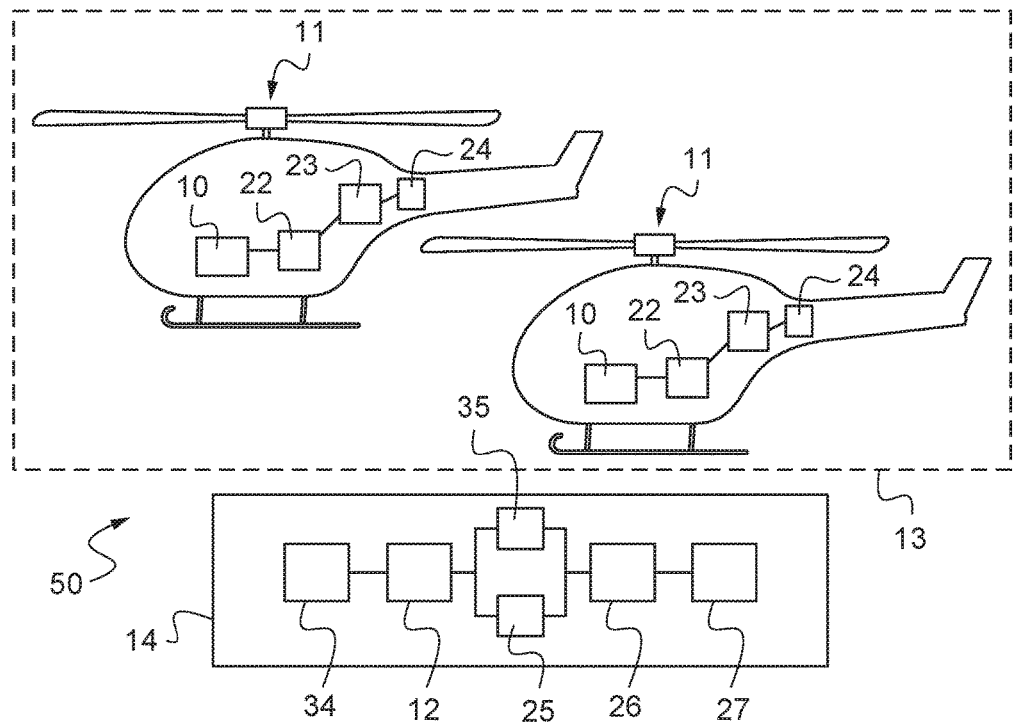

As shown in FIG. 1, the monitor system 50 serves to monitor the reliability of a piece of electronic equipment 10 arranged in the same aircraft 11. The monitor system 50 comprises monitor means 22, concatenation means 23, and transmission means 24 installed in the aircraft 11.

The monitor means 22 measure variations in a state parameter P such as the temperature that exists in or in the proximity of the piece of electronic equipment 10 as a function of time t.

The concatenation means 23 serve to form data groups $(t_i, P_i, S_j)$ comprising an instant $t_i$ representative of a sampling time parameter of the monitor means 22, a value $P_i$ of a state parameter P measured at the instant $t_i$, and an identification number $S_j$ specific to the piece of electronic equipment 10.

The transmission means 24 serve to transmit the data $t_i$, $P_i$, $S_j$, or the data groups $(t_i, P_i, S_j)$ to complementary transmission means 34 arranged in an external unit 14 arranged outside the aircraft 11. Such an external unit 14 then comprises a centralized unit 12 for collecting and storing a set E of data groups $(t_i, P_i, S_j)$ coming from a fleet 13 of aircraft 11.

The external unit 14 also has first computation means 25 for determining an observed reliability $R_{obs}$ of electronic equipment 10 in the fleet 13 of aircraft 11 by means of the set E of data groups $(t_i, P_i, S_j)$ contained in the centralized unit 12.

The external unit 14 also has second computation means 35 for determining an expected reliability $R_{exp}$ of electronic equipment 10 for the fleet 13 of aircraft 11 on the basis firstly of the set E of data groups $(t_i, P_i, S_j)$ as collected and stored in the centralized unit 12, and secondly of a predicted reliability $R_{pred}$ determined by calculation upstream from making use of the electronic equipment 10 on the fleet 13 of aircraft 11.

Furthermore, the external unit 14 has comparator means 26 for comparing the observed reliability $R_{obs}$ of the electronic equipment 10 with the expected reliability $R_{exp}$ as calculated from the collected data groups $(t_i, P_i, S_j)$ and from the predicted reliability $R_{pred}$, which is itself calculated and issued by the manufacturer or the supplier of the electronic equipment 10.

Finally, the external unit 14 has warning means 27 for warning a person or a crew when the observed reliability $R_{obs}$ is less than the expected reliability $R_{exp}$ for the electronic equipment 10.

Such an external unit 14 may also be arranged in premises belonging to the manufacturer of the fleet 13 of aircraft 11, or to an operator using the fleet 13 of aircraft 11, or belonging to a third party responsible for maintaining the electronic equipment 10, and/or finally belonging to the manufacturer of the electronic equipment 10.

Figure 2:
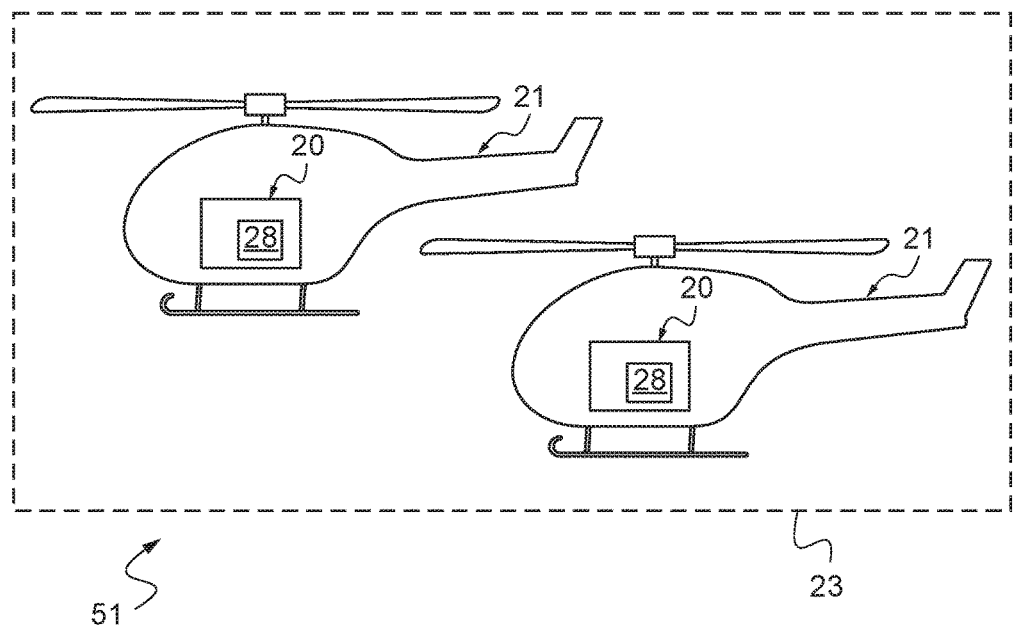

As shown in FIGS. 2 to 4, in three other variants, such monitor systems 51, 52, 53 may also include respective memories 28, 29, 38 for storing respective data groups $(t_i, P_i, S_j)$ specific to each piece of electronic equipment 20, 30, 40. The second and third variants corresponding to FIGS. 2 and 3 relate to a first example of the above-mentioned monitor system in which a respective memory 28, 29 is arranged on each aircraft 21, 31.

Thus, in a second variant as shown in FIG. 2, the monitor system 51 has a memory 28 arranged in the electronic equipment 20. This electronic equipment 20 is thus installed in an aircraft 21 of a fleet 23 of aircraft 21. The data groups $(t_i, P_i, S_j)$ are thus stored in the memory 28 of the electronic equipment 20 and can thus subsequently be transmitted or copied to a centralized unit 12.

In a third variant as shown in FIG. 3, the monitor system 52 has a memory 29 arranged in an aircraft 31 but outside the electronic equipment 30. As above, the data groups $(t_i, P_i, S_j)$ are thus stored in the memory 29 of the aircraft 31 in a fleet 33 of aircraft 31, from which they are transmitted or copied to a centralized unit 12.

Finally, in a fourth variant, as shown in FIG. 4 and corresponding to a second example of the above-described monitor system, the monitor system 53 has a memory 38 arranged in a central unit 32 of an external unit 44. Under such circumstances, the data groups ($t_i$, $P_i$, $S_j$) from the aircraft 41 of the fleet 43 are transmitted directly to the centralized unit 32 without being stored in the aircraft 41 of the fleet 43. The transmission means 34 thus necessarily make use of wireless and contactless technology for transmitting the data groups ($t_i$, $P_i$, $S_j$), even while the aircraft 41 having the pieces of electronic equipment 40 are on flying missions.

As shown in FIG. 5, the invention also relates to a method 1 of monitoring the reliability of a piece of electronic equipment 10 arranged in an aircraft 11, where such a monitoring method 1 comprises a plurality of steps that may be run in succession or in parallel. These steps thus comprise a monitoring step 2, a concatenation step 3, a transmission step 4, a first computation step 5, a second computation step 15, a comparison step 6, and a warning step 7.

Consequently, the monitoring method 1 includes a monitoring step 2 for measuring variations of at least one state parameter P as a function of time t.

The monitoring method 1 thus also performs a concatenation step 3 for generating data groups ($t_i$, $P_i$, $S_j$), each made up of an instant $t_i$ representative of a sampling time parameter of the monitoring step 2, a value $P_i$ of the state parameter P as measured at the instant $t_i$, and an identification number $S_j$ specific to each piece of electronic equipment 10.

In addition, the monitor method 1 includes a transmission step 4 for transmitting the data groups ($t_i$, $P_i$, $S_j$) to a centralized unit 12. Such a centralized unit 12 then serves to collect and store a set E of data groups ($t_i$, $P_i$, $S_j$) from a fleet 13 of aircraft 11 including such pieces of electronic equipment 10.

As shown in FIG. 5, the concatenation step 3 may take place before the transmission step. Nevertheless, in another example as shown in FIG. 6, the monitoring method 61 may also have a transmission step 4 for transmitting the data $t_i$, $P_i$, $S_j$ to a centralized unit 12 prior to performing the concatenation step 3 for generating data groups ($t_i$, $P_i$, $S_j$).

Thereafter, the monitoring methods 1 and 61 perform in parallel:

a first computation step 5 for determining an observed reliability $R_{obs}$ of the electronic equipment 10 on the basis firstly of the set E of data groups ($t_i$, $P_i$, $S_j$) collected and stored in the centralized unit 12, and secondly from failure data $D_p$ generated when replacing a defective piece of electronic equipment 10; and a second computation step 15 for determining an expected reliability $R_{exp}$ for the electronic equipment 10 on the basis firstly of the set E of data groups ($t_i$, $P_i$, $S_j$) as collected and stored in the centralized unit 12, and secondly of the predicted reliability $R_{pred}$ determined by calculation upstream from using the piece(s) of electronic equipment on the fleet of aircraft.

Furthermore, each of the monitoring methods 1 and 61 includes a respective comparison step 6 for comparing the observed reliability $R_{obs}$ of the electronic equipment 10 with the expected reliability $R_{exp}$ for the electronic equipment 10.

Finally, the monitoring methods 1 and 61 perform a warning step 7 for issuing a warning when the observed reliability $R_{obs}$ of the electronic equipment 10 is less than the expected reliability $R_{exp}$ for the electronic equipment 10.

By way of example, such a warning step 7 may be performed by sending a warning message that is transmitted to a person in charge of monitoring the reliability of the electronic equipment 10 in a fleet 13 of aircraft 11. Such a warning message may then in particular be in the form of an SMS, an MMS, or indeed an email.

As shown in FIGS. 7 and 8, in first and second implementations of a monitoring method 71, 81 for monitoring the reliability of a piece of electronic equipment 20, 30, 40 arranged in an aircraft 21, 31, 41, such a monitoring method 71, 81 may also include a storage step 8, 18 for storing the data groups ($t_i$, $P_i$, $S_j$) for each piece of electronic equipment 20, 30, 40.

As shown in FIG. 7, in the first above-described implementation, the monitoring method 71 has a storage step 8 that is performed before the transmission step 4. Under such circumstances, the data groups ($t_i$, $P_i$, $S_j$) for each piece of equipment 20, 30 may be stored on board the aircraft 21, 31 and transmitted subsequently, e.g. during a maintenance operation on the aircraft 21, 31.

Furthermore, and as shown in FIG. 8, in the second above-described implementation, the monitoring method 81 includes a storage step 18 performed after the transmission step 4. Under such circumstances, the data groups ($t_i$, $P_i$, $S_j$) from each piece of equipment 40 are not stored on board the aircraft 41. Once these data groups ($t_i$, $P_i$, $S_j$) have been concatenated, they are transmitted directly to the centralized unit 32 in order to enable the computation step 5 to be performed.

As shown in FIG. 8, the monitoring method 81 may perform the following steps in succession one after the other:

the first computation step 5 for determining an observed reliability $R_{obs}$ of the electronic equipment 10 firstly from the set E of data groups ($t_i$, $P_i$, $S_j$) collected and stored in the centralized unit 12 and secondly from failure data $D_p$ generated when replacing a faulty piece of electronic equipment 10; and the second computation step 15 for determining an expected reliability $R_{exp}$ of the electronic equipment 10 firstly from a set E of data groups ($t_i$, $P_i$, $S_j$) collected and stored in the centralized unit 12, and secondly from the predicted reliability $R_{pred}$ determined by calculation upstream from using the electronic equipment 10 on the fleet 13 of aircraft 11.

Naturally, the present invention may be subjected to numerous variations as to its implementation. Although several embodiments are described, it will readily be understood that it is not conceivable to identify exhaustively all possible embodiments. It is naturally possible to envisage replacing any of the means described by equivalent means without going beyond the ambit of the present invention.

What is claimed is:

1. A monitoring method for monitoring the reliability of at least one piece of electronic equipment installed in an aircraft, wherein, for each of the at least one piece of electronic equipment, the monitoring method performs the following steps:

a measuring step for measuring variations of at least one state parameter P as a function of time t;

a concatenation step for generating data groups ($t_i$, $P_i$, $S_j$), each formed respectively by:

an instant $t_i$ representative of a sampling time parameter of the monitoring step of the monitoring method;

a value $P_i$ of the at least one state parameter P measured at the instant $t_i$; and an identification number $S_j$ specific to the or each of the at least one piece of electronic equipment;

a transmission step for transmitting the data $t_i$, $P_i$, $S_j$ to a centralized unit serving to collect and store a set E of data groups ($t_i$, $P_i$, $S_j$) from a fleet of aircraft including the at least one piece of electronic equipment;

a first computation step for determining an observed reliability $R_{obs}$ of the at least one piece of electronic equipment for the fleet of aircraft, firstly from the set E of data groups $(t_i, P_i, S_j)$ collected and stored in the centralized unit, and secondly from failure data $D_p$ generated when replacing a defective one of the at least one piece of electronic equipment;

a second computation step for determining an expected reliability $R_{exp}$ of the at least one piece of electronic equipment for the fleet of aircraft, firstly from the set E of data groups $(t_i, P_i, S_j)$ collected and stored in the centralized unit and secondly from a predicted reliability $R_{pred}$ determined by calculation upstream from using the piece(s) of electronic equipment on the fleet of aircraft;

a comparison step of comparing the observed reliability $R_{obs}$ for the at least one piece of electronic equipment with the expected reliability $R_{exp}$ for the at least one piece of electronic equipment; and a warning step for issuing a warning when the observed reliability $R_{obs}$ of the at least one piece of electronic equipment is less than the expected reliability $R_{exp}$ for the at least one piece of electronic equipment.

2. A monitoring method according to claim 1, wherein the first computation step for determining an observed reliability $R_{obs}$ for the at least one piece of electronic equipment is obtained from an observed reliability of a sample $R_{smpl}$, the sample comprising a limited number of the at least one piece of electronic equipment.

3. A monitoring method according to claim 1, wherein the monitoring method includes at least one storage step enabling the data groups $(t_i, P_i, S_j)$ specific to each piece of equipment to be stored.

4. A monitoring method according to claim 3, wherein the at least one storage step is performed before the transmission step in order to transmit the data groups $(t_i, P_i, S_j)$ to the centralized unit.

5. A monitoring method according to claim 3, wherein the at least one storage step is performed after the transmission step for transmitting the data groups $(t_i, P_i, S_j)$ to the centralized unit.

6. A monitoring method according to claim 1, wherein the at least one state parameter P is selected from the group comprising the surrounding temperature, the surrounding humidity, the surrounding atmospheric pressure, the salinity level of the surrounding air, the pollution level of the surrounding air, the electrical power supply voltage, electrically switching on/off, and the waveform of the input/output signals of the electronic equipment.

7. A monitor system for monitoring the reliability of at least one piece of electronic equipment installed in an aircraft, wherein, in order to monitor each of the at least one piece of electronic equipment, the monitor system comprises:

monitoring means for measuring variations of at least one state parameter P as a function of time t;

concatenation means for generating data groups $(t_i, P_i, S_j)$, each formed respectively by:

an instant $t_i$ representative of a sampling time parameter for the monitoring means;

a value $P_i$ of the at least one state parameter P measured at the instant $t_i$; and an identification number $S_j$ specific to the or each of the at least one piece of electronic equipment;

transmission means for transmitting the data groups $(t_i, P_i, S_j)$ to a centralized unit serving to collect and store a set E of data groups $(t_i, P_i, S_j)$ from a fleet of aircraft including the at least one piece of electronic equipment;

first computation means for determining an observed reliability $R_{obs}$ of the at least one piece of electronic equipment for the fleet of aircraft, firstly from the set E of data groups $(t_i, P_i, S_j)$ collected and stored in the centralized unit, and secondly from failure data $D_p$ generated when replacing a defective one of the at least one piece of electronic equipment;

second computation means for determining an expected reliability $R_{exp}$ of the or each piece of electronic equipment for the fleet of aircraft, firstly from the set E of data groups $(t_i, P_i, S_j)$ collected and stored in the centralized unit and secondly from a predicted reliability $R_{pred}$ determined by calculation upstream from using the piece(s) of electronic equipment on the fleet of aircraft;

comparator means for comparing the observed reliability $R_{obs}$ for the at least one piece of electronic equipment with the expected reliability $R_{exp}$ for the at least one piece of electronic equipment; and warning means for issuing a warning when the observed reliability $R_{obs}$ of the at least one piece of electronic equipment is less than the expected reliability $R_{exp}$ for the at least one piece of electronic equipment.

8. A monitor system according to claim 7, wherein the monitor system includes at least one memory for storing the data groups $(t_i, P_i, S_j)$ specific to each piece of electronic equipment.

9. A monitor system according to claim 8, wherein the at least one memory is arranged on each of the aircraft of the fleet.

10. A monitor system according to claim 9, wherein the at least one memory is arranged inside the at least one piece of electronic equipment.

11. A monitor system according to claim 9, wherein the at least one memory is arranged outside the at least one piece of electronic equipment.

12. A monitor system according to claim 8, wherein the at least one memory is arranged in the centralized unit outside each of the aircraft of the fleet.

13. A monitor system according to claim 7, wherein the at least one state parameter P is selected from the group comprising the surrounding temperature, the surrounding humidity, the surrounding atmospheric pressure, the salinity level of the surrounding air, the pollution level of the surrounding air, the electrical power supply voltage, electrically switching on/off, and the waveform of the input/output signals of the electronic equipment.

* * * * *